(12) United States Patent
Ting

(10) Patent No.: US 8,698,163 B2
(45) Date of Patent: Apr. 15, 2014

(54) P-TYPE DOPING LAYERS FOR USE WITH LIGHT EMITTING DEVICES

(75) Inventor: Steve Ting, Dublin, CA (US)

(73) Assignee: Toshiba Techno Center Inc., Tokyo (JP)

( * ) Notice: Subject to any disclaimer, the term of this patent is extended or adjusted under 35 U.S.C. 154(b) by 0 days.

(21) Appl. No.: 13/248,821

(22) Filed: Sep. 29, 2011

(65) Prior Publication Data

US 2013/0082273 A1    Apr. 4, 2013

(51) Int. Cl.
*H01L 33/30*    (2010.01)

(52) U.S. Cl.
USPC ........... 257/76; 257/13; 257/14; 257/E33.025

(58) Field of Classification Search
USPC .................................................... 257/13–15
See application file for complete search history.

(56) References Cited

U.S. PATENT DOCUMENTS

| | | |
|---|---|---|
| 5,306,662 A | 4/1994 | Nakamura et al. |
| 5,408,120 A | 4/1995 | Manabe et al. |
| 5,432,808 A | 7/1995 | Hatano et al. |
| 5,468,678 A | 11/1995 | Nakamura et al. |
| 5,563,422 A | 10/1996 | Nakamura et al. |
| 5,578,839 A | 11/1996 | Nakamura et al. |
| 5,734,182 A | 3/1998 | Nakamura et al. |
| 5,747,832 A | 5/1998 | Nakamura et al. |
| 5,753,939 A | 5/1998 | Sassa et al. |
| 5,766,783 A | 6/1998 | Utsumi et al. |
| 5,777,350 A | 7/1998 | Nakamura et al. |
| 5,959,307 A | 9/1999 | Nakamura et al. |
| 5,959,401 A | 9/1999 | Asami et al. |
| 6,005,258 A | 12/1999 | Manabe et al. |
| 6,040,588 A | 3/2000 | Koide et al. |
| 6,045,626 A | 4/2000 | Yano et al. |
| 6,067,309 A | 5/2000 | Onomura et al. |
| RE36,747 E | 6/2000 | Manabe et al. |
| 6,121,635 A | 9/2000 | Watanabe et al. |
| 6,215,133 B1 | 4/2001 | Nakamura et al. |
| 6,242,764 B1 | 6/2001 | Ohba et al. |

(Continued)

FOREIGN PATENT DOCUMENTS

| | | |
|---|---|---|
| JP | 4267376 | 9/1992 |
| JP | 2626431 A | 5/1994 |

(Continued)

OTHER PUBLICATIONS

Bae, et al. Surface Investigation of a Cubic AlN Buffer Layer and GaN Grown on Si(111) and Si(100) as Revealed by Atomic Force Microscopy. Journal of the Korean Physical Society, vol. 49, No. 3, Sep. 2006, pp. 1092-1096.

(Continued)

*Primary Examiner* — Thanh Nguyen
(74) *Attorney, Agent, or Firm* — Hogan Lovells US LLP

(57) ABSTRACT

A light emitting diode (LED) comprises an n-type Group III-V semiconductor layer, an active layer adjacent to the n-type Group III-V semiconductor layer, and a p-type Group III-V semiconductor layer adjacent to the active layer. The active layer includes one or more V-pits. A portion of the p-type Group III-V semiconductor layer is in the V-pits. A p-type dopant injection layer provided during the formation of the p-type Group III-V layer aids in providing a predetermined concentration, distribution and/or uniformity of the p-type dopant in the V-pits.

32 Claims, 7 Drawing Sheets

(56) References Cited

U.S. PATENT DOCUMENTS

| | | |
|---|---|---|
| 6,265,726 B1 | 7/2001 | Manabe et al. |
| 6,326,236 B1 | 12/2001 | Koide et al. |
| 6,420,733 B2 | 7/2002 | Koide et al. |
| 6,441,403 B1 | 8/2002 | Chang et al. |
| 6,469,324 B1 | 10/2002 | Wang |
| 6,541,293 B2 | 4/2003 | Koide et al. |
| 6,610,995 B2 | 8/2003 | Nakamura et al. |
| 6,611,002 B2 | 8/2003 | Weeks et al. |
| 6,617,060 B2 | 9/2003 | Weeks et al. |
| 6,649,287 B2 | 11/2003 | Weeks, Jr. et al. |
| 6,657,236 B1 | 12/2003 | Thibeault et al. |
| 6,784,462 B2 | 8/2004 | Schubert |
| 6,800,500 B2 | 10/2004 | Coman et al. |
| 6,838,693 B2 | 1/2005 | Kozaki |
| 6,849,881 B1 | 2/2005 | Harle et al. |
| 6,891,197 B2 | 5/2005 | Bhat et al. |
| 6,906,352 B2 | 6/2005 | Edmond et al. |
| 6,916,676 B2 | 7/2005 | Sano et al. |
| 6,951,695 B2 | 10/2005 | Xu et al. |
| 6,977,395 B2 | 12/2005 | Yamada et al. |
| 7,001,791 B2 | 2/2006 | Kryliouk et al. |
| 7,026,653 B2 | 4/2006 | Sun |
| 7,071,498 B2 | 7/2006 | Johnson et al. |
| 7,106,090 B2 | 9/2006 | Harle et al. |
| 7,115,908 B2 | 10/2006 | Watanabe et al. |
| 7,138,286 B2 | 11/2006 | Manabe et al. |
| 7,148,517 B2 | 12/2006 | Tu et al. |
| 7,154,121 B2 | 12/2006 | Hsieh et al. |
| 7,193,246 B1 | 3/2007 | Tanizawa et al. |
| 7,247,889 B2 | 7/2007 | Hanson et al. |
| 7,247,985 B2 | 7/2007 | Kaneko et al. |
| 7,262,436 B2 | 8/2007 | Kondoh et al. |
| 7,312,474 B2 | 12/2007 | Emerson et al. |
| 7,322,732 B2 | 1/2008 | Negley et al. |
| 7,323,764 B2 | 1/2008 | Wallis |
| 7,326,967 B2 | 2/2008 | Hsieh et al. |
| 7,327,036 B2 | 2/2008 | Borghs et al. |
| 7,335,920 B2 | 2/2008 | Denbaars et al. |
| 7,339,205 B2 | 3/2008 | Piner et al. |
| 7,345,297 B2 | 3/2008 | Yamazoe et al. |
| 7,348,602 B2 | 3/2008 | Tanizawa |
| 7,402,838 B2 | 7/2008 | Tanizawa et al. |
| 7,442,966 B2 | 10/2008 | Bader et al. |
| 7,446,345 B2 | 11/2008 | Emerson et al. |
| 7,491,565 B2 | 2/2009 | Coman et al. |
| 7,547,908 B2 | 6/2009 | Grillot et al. |
| 7,547,925 B2 | 6/2009 | Wong et al. |
| 7,598,108 B2 | 10/2009 | Li et al. |
| 7,611,917 B2 | 11/2009 | Emerson et al. |
| 7,615,420 B2 | 11/2009 | Jiang et al. |
| 7,674,639 B2 | 3/2010 | Lester |
| 7,687,827 B2 | 3/2010 | Piner et al. |
| 7,691,651 B2 | 4/2010 | Park |
| 7,709,851 B2 | 5/2010 | Bader et al. |
| 7,737,459 B2 | 6/2010 | Edmond et al. |
| 7,754,514 B2 | 7/2010 | Yajima et al. |
| 7,781,356 B2 | 8/2010 | Kouvetakis et al. |
| 7,791,061 B2 | 9/2010 | Edmond et al. |
| 7,791,101 B2 | 9/2010 | Bergmann et al. |
| 7,791,106 B2 | 9/2010 | Piner et al. |
| 7,795,623 B2 | 9/2010 | Emerson et al. |
| 7,813,400 B2 | 10/2010 | Denbaars et al. |
| 7,821,024 B2 | 10/2010 | Jeong |
| 7,910,945 B2 | 3/2011 | Donofrio et al. |
| 7,928,471 B2 | 4/2011 | Mastro et al. |
| 7,939,844 B2 | 5/2011 | Hahn et al. |
| 7,947,994 B2 | 5/2011 | Tanizawa et al. |
| 7,968,865 B2 | 6/2011 | LaRoche et al. |
| 8,021,904 B2 | 9/2011 | Chitnis |
| 8,030,665 B2 | 10/2011 | Nagahama et al. |
| 2003/0178642 A1 | 9/2003 | Tanaka et al. |
| 2005/0106849 A1 | 5/2005 | Gwo |
| 2006/0006500 A1 | 1/2006 | Piner et al. |
| 2006/0246612 A1* | 11/2006 | Emerson et al. ............... 438/22 |
| 2007/0114511 A1 | 5/2007 | Kim et al. |
| 2007/0210304 A1 | 9/2007 | Komiyama et al. |
| 2007/0295985 A1 | 12/2007 | Weeks, Jr. et al. |
| 2008/0200013 A1 | 8/2008 | Piner et al. |
| 2008/0261403 A1 | 10/2008 | Wang et al. |
| 2009/0152578 A1 | 6/2009 | Lee |
| 2009/0261363 A1 | 10/2009 | Chen et al. |
| 2009/0321780 A1 | 12/2009 | Huang et al. |
| 2010/0019263 A1 | 1/2010 | Yeh et al. |
| 2010/0038669 A1 | 2/2010 | McKenzie |
| 2010/0166983 A1 | 7/2010 | Cho et al. |
| 2010/0176369 A2 | 7/2010 | Oliver et al. |
| 2010/0207097 A1 | 8/2010 | Oh et al. |
| 2011/0003420 A1 | 1/2011 | Chen et al. |
| 2011/0012155 A1 | 1/2011 | Huang et al. |
| 2011/0049546 A1 | 3/2011 | Heikman et al. |
| 2011/0309327 A1* | 12/2011 | Jeong ........................... 257/13 |

FOREIGN PATENT DOCUMENTS

| | | |
|---|---|---|
| JP | 2681733 A | 5/1994 |
| JP | 2917742 A | 6/1994 |
| JP | 2827794 A | 8/1994 |
| JP | 2778405 A | 9/1994 |
| JP | 2803741 A | 9/1994 |
| JP | 2785254 A | 1/1995 |
| JP | 2956489 A | 3/1996 |
| JP | 2666237 A | 4/1996 |
| JP | 2735057 A | 9/1996 |
| JP | 8264894 | 10/1996 |
| JP | 2890396 A | 12/1996 |
| JP | 3250438 A | 12/1996 |
| JP | 3135041 A | 6/1997 |
| JP | 3209096 A | 12/1997 |
| JP | 3506874 A | 1/1998 |
| JP | 3654738 A | 2/1998 |
| JP | 3795624 A | 2/1998 |
| JP | 3304787 A | 5/1998 |
| JP | 3344257 A | 8/1998 |
| JP | 3223832 A | 9/1998 |
| JP | 3374737 A | 12/1998 |
| JP | 11040847 | 2/1999 |
| JP | 3314666 A | 3/1999 |
| JP | 4118370 A | 7/1999 |
| JP | 4118371 A | 7/1999 |
| JP | 3548442 A | 8/1999 |
| JP | 3622562 A | 11/1999 |
| JP | 3424629 A | 8/2000 |
| JP | 4860024 A | 8/2000 |
| JP | 3063756 A | 9/2000 |
| JP | 4629178 A | 9/2000 |
| JP | 3063757 A | 10/2000 |
| JP | 3511970 A | 10/2000 |
| JP | 3551101 A | 5/2001 |
| JP | 3427265 A | 6/2001 |
| JP | 3646649 A | 10/2001 |
| JP | 3780887 A | 5/2002 |
| JP | 3890930 A | 5/2002 |
| JP | 3786114 A | 4/2004 |
| JP | 3748011 | 2/2006 |
| JP | 4904261 B2 | 1/2012 |

OTHER PUBLICATIONS

Cooke, M. High-Brightness Nitride LEDs on Silicon Through Wafer Bonding. Available at http://www.semiconductor—today.com/news_items/2011/JUNE/KOREAPHOTONICS_040611.html. Accessed Nov. 8, 2011.

Dadgar, et al. Epitaxy of GaN on silicon—impact of symmetry and surface reconstruction. New Journal of Physics, vol. 9, No. 389 (2007); IOP Publishing Ltd., http://iopscience.iop.org/1367-2630/9/10/389.

Zang, et al. Structural analysis of metalorganic chemical vapor deposited AlN nucleation layers on Si(111). Singapore-MIT Alliance, Jan. 2004, citable URI: http://hdl.handle.net/1721.1/3841 (4 pages).

U.S. Appl. No. 13/249,146, filed Sep. 29, 2011, Ramer.

U.S. Appl. No. 13/249,157, filed Sep. 29, 2011, Yang.

(56) References Cited

OTHER PUBLICATIONS

U.S. Appl. No. 13/249,184, filed Sep. 29, 2011, Yan.

U.S. Appl. No. 13/249,196, filed Sep. 29, 2011, Lin.

Arslan, et al. Buffer optimization for crack-free GaN epitaxial layers grown on Si(111) substrate by MOCVD. J. Phys. D: Appl. Phys. 2008; 41:155317-1-10.

Hageman, et al. Growth of GaN epilayers on Si(111) substrates using multiple buffer layers. Mat. Res. Soc. Symp. Proc. 2002; 693:1-6.

Hang, et al. Influence of an Advanced Buffer Layer on the Optical Properties of an InGaN/GaN MQW Grown on a (111) Silicon Substrate. J. Kor. Phys. Soc. Mar. 2007; 50(3):797-800.

Hangleiter, et al. Suppression of Nonradiative Recombination by V-Shaped Pits in GaInN/GaN Quantum Wells Produces a Large Increase in the Light Emission Efficiency. PRL. 2005; 95(12):127402-1-127402-4.

Hao, et al. Highly efficient GaN-based light emitting diodes with micropits. Appl. Phys. Letts. 2006; 89:241907-1-241907-3.

Hsu, et al. Crack-Free High-Brightness InGaN/GaN LEDs on Si(111) with Initial AlGaN Buffer and Two LT-Al Interlayers. J. Elec. Soc. 2007; 154:H191-H193.

Kim, et al. Light Extraction in GaInN Light-Emitting Diodes using Diffuse Omnidirectional Reflectors. J. Elec. Soc. 2006; 153(2):G105-G107.

Lee, et al. High brightness GaN-based light-emitting diodes. J. Display Tech. Jun. 2007; 3(2):118-125.

Li, et al. Growth of III-nitride photonic structures on large area silicon substrates. Appl. Phys. Letts. 2006; 88:171909-1-3.

Liang, et al. Synthesis and characterization of heteroepitaxial GaN films on Si(111). Vacuum. 2010; 84:1154-1158.

Lin, et al. Growth of GaN film on 150 mm Si (111) using multilayer AlN/AlGaN buffer by metal-organic vapor phase epitaxy method. Appl. Phys. Letts. 2007; 91:222111-1-3.

Office action dated Feb. 27, 2013 for U.S. Appl. No. 13/249,146.

Pal, et al. Silicon a new substrate for GaN growth. Bull. Mater. Sci. Dec. 2004; 27(6):501-504.

Xi, et al. High Light-Extraction Efficiency in GaInN Light-Emitting Diode with Pyramid Reflector. Proc. of SPIE. 2007; 6486:648606-1-8.

Xiang, et al. High quality GaN epilayers grown on Si (111) with thin nonlinearly composition-graded $Al_xGa1-xN$ interlayers via metal-organic chemical vapor deposition. Journal of Alloys and Compounds. 2011; 509:2227-2231.

Zhu, et al. GaN-based LEDs grown on 6-inch diameter Si (111) substrates by MOVPE. Proc. of SPIE. 2006; 7231:723118-1-11.

\* cited by examiner

US 8,698,163 B2

P-TYPE DOPING LAYERS FOR USE WITH LIGHT EMITTING DEVICES

BACKGROUND

Lighting applications typically use incandescent or gas-filled bulbs. Such bulbs typically do not have long operating lifetimes and thus require frequent replacement. Gas-filled tubes, such as fluorescent or neon tubes, may have longer lifetimes, but operate using high voltages and are relatively expensive. Further, both bulbs and gas-filled tubes consume substantial amounts of energy.

A light emitting diode (LED) is a device that emits light upon the recombination of electrons and holes in an active layer of the LED. An LED typically includes a chip of semiconducting material doped with impurities to create a p-n junction. Current flows from the p-side, or anode, to the n-side, or cathode. Charge-carriers—electrons and holes—flow into the p-n junction from electrodes with different voltages. When an electron meets a hole, the electron recombines with the hole in a process that may result in the radiative emission of energy in the form of one or more photons (hv). The photons, or light, are transmitted out of the LED and employed for use in various applications, such as, for example, lighting applications and electronics applications. LED's, in contrast to incandescent or gas-filled bulbs, are relatively inexpensive, operate at low voltages, and have long operating lifetimes. Additionally, LED's consume relatively little power and are compact. These attributes make LED's particularly desirable and well suited for many applications.

Despite the advantages of LED's, there are limitations associated with such devices. Such limitations include materials limitations, which may limit the efficiency of LED's; structural limitations, which may limit transmission of light generated by an LED out of the device; and manufacturing limitations, which may lead to high processing costs. Accordingly, there is a need for improved LED's and methods for manufacturing LED's.

SUMMARY

An aspect of the invention provides light emitting devices, such as light emitting diodes (LED's). In an embodiment, a light emitting diode includes an n-type gallium nitride (GaN) layer, which is doped with an n-type dopant, and an active layer adjacent to the n-type GaN layer. The active layer can have one or more V-pits. A p-type GaN layer is adjacent to the active layer. The p-type GaN layer is doped with a p-type dopant. The p-type GaN layer includes a first portion and a second portion laterally bounded by the one or more V-pits. The first portion is disposed over the active layer. The second portion has a uniform concentration of a p-type dopant.

In another embodiment, a light emitting diode (LED) includes a silicon substrate and an n-GaN layer adjacent to the silicon substrate. An active layer is adjacent to the n-GaN layer and an electron blocking layer is adjacent to the active layer. A p-GaN layer is adjacent to the electron blocking layer. The LED comprises Mg and In at an interface between the electron blocking layer and the p-GaN layer.

In another embodiment, a light emitting device includes a first layer, which has n-type gallium nitride (GaN), and a second layer adjacent to the first layer. The second layer includes an active material configured to generate light upon the recombination of electrons and holes. The second layer further includes one or more V-pits. A third layer is adjacent to the second layer. The third layer includes p-type GaN having a uniform distribution of a p-type dopant across a portion of the third layer extending into the one or more V-pits.

In another embodiment, a light emitting diode (LED) includes a first layer, which has n-type gallium nitride (GaN), and a second layer adjacent to the first layer. The second layer includes an active material configured to generate light upon the recombination of electrons and holes. A third layer is disposed adjacent to the second layer. The third layer includes a p-type dopant and a wetting material configured to enable the p-type dopant to uniformly distribute in the third layer.

In another embodiment, a light emitting diode includes an n-type gallium nitride (GaN) layer and an active layer adjacent to the n-type GaN layer. The active layer can have one or more V-pits. A p-type GaN layer is adjacent to the active layer. The p-type GaN layer includes a first portion and a second portion laterally bounded by the one or more V-pits. The first portion is disposed over the active layer. The second portion has a concentration of a p-type dopant of at least about $1 \times 10^{19}$ cm$^{-3}$.

In another embodiment, a light emitting diode includes a first layer, which has either an n-type gallium nitride (GaN) or a p-type GaN, and an active layer. The active layer is adjacent to the first layer and can have one or more V-pits. The light emitting diode further includes a second layer having either the n-type GaN or p-type GaN that was not used in the first layer. In other words the first and second layer each have a different one of the n-type GaN or p-type GaN materials. The second layer includes a first portion and a second portion. The second portion is laterally bounded by the one or more V-pits. The first portion is disposed over the active layer. The second portion has a uniform concentration of a p-type dopant.

In another embodiment, a light emitting device includes a first layer, which has either an n-type Group III-V semiconductor or a p-type Group III-V semiconductor, and an active layer. The active layer is adjacent to the first layer and can have one or more V-pits. The light emitting diode further includes a second layer having either the n-type Group III-V semiconductor or the p-type Group III-V semiconductor that was not used in the first layer. In other words the first and second layer each have a different one of the n-type Group III-V semiconductor or the p-type Group III-V semiconductor. The second layer includes a first portion and a second portion. The second portion is laterally bounded by the one or more V-pits, and the first portion is disposed over the active layer. The second portion has a uniform concentration of a p-type dopant.

Another aspect of the invention provides methods for forming light emitting devices, such as light emitting diodes. In an embodiment, a method for forming a light emitting diode includes delta doping a wetting layer with a p-type dopant. The wetting layer is formed adjacent to an electron blocking layer, and the electron blocking layer is formed adjacent to an active layer. The active layer is formed adjacent to an n-type Group III-V semiconductor layer, and the n-type Group III-V semiconductor layer is formed adjacent to a substrate. In some embodiments, the wetting layer is in direct contact with the electron blocking layer. In some embodiments, the electron blocking layer is in direct contact with the active layer. In some embodiments, the active layer is in direct contact with the n-type Group III-V semiconductor layer.

In another embodiment, a method for forming a light emitting device, such as a light emitting diode, includes forming, over a substrate in a reaction chamber (or reaction space if the reaction chamber includes a plurality of reaction spaces), a p-type Group III-V semiconductor layer adjacent to an active layer. The p-type Group III-V semiconductor layer extends into one or more V-pits of the active layer. The p-type Group III-V semiconductor layer is formed by delta doping a wetting layer with a p-type dopant, and introducing a source gas of a Group III species and a source gas of a Group V species into the reaction chamber. In some situations, the wetting layer is formed adjacent to the active layer. In an example, the wetting layer is formed on the active layer.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings of which.

DETAILED DESCRIPTION

Figure 1:
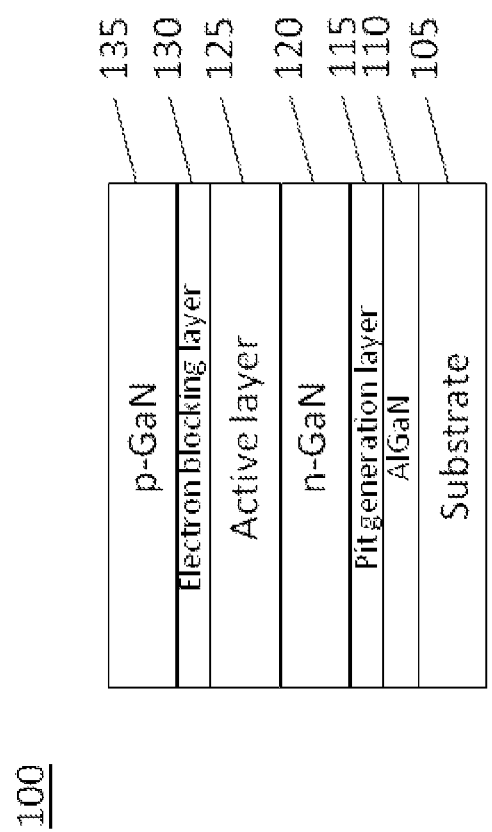
FIG. 1 schematically illustrates a light emitting diode.

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed in practicing the invention.

The term "light emitting device," as used herein, refers to a device configured to generate light upon the recombination of electrons and holes in a light emitting region (or "active layer") of the device. A light emitting device in some cases is a solid state device that converts electrical energy to light. A light emitting diode ("LED") is a light emitting device. There are examples of LED device structures that are made of different materials and have different structures and perform in a variety of ways. Some LED's emit laser light, and others generate non-monochromatic light. Some LED's are optimized for performance in particular applications. An LED may be a so-called blue LED comprising a multiple quantum well (MQW) active layer having indium gallium nitride. A blue LED may emit non-monochromatic light having a wavelength in a range from about 440 nanometers to 500 nanometers while having an average current density of 38 amperes per square centimeter or more. A phosphor coating may be provided that absorbs some of the emitted blue light. The phosphor in turn fluoresces to emit light of other wavelengths so that the light the overall LED device emits has a wider range of wavelengths.

The term "layer," as used herein, refers to a layer of atoms or molecules on a substrate. In some cases, a layer includes an epitaxial layer or a plurality of epitaxial layers. A layer may include a film or thin film, or a plurality of films or thin films. In some situations, a layer is a structural component of a device (e.g., light emitting diode) serving a predetermined device function, such as, for example, an active layer that is configured to generate light. A layer generally has a thickness from about one monoatomic monolayer (ML) to tens of monolayers, hundreds of monolayers, thousands of monolayers, millions of monolayers, billions of monolayers, trillions of monolayers, or more. In an example, a layer is a multilayer structure having a thickness greater than one monoatomic monolayer. In addition, a layer may include multiple material layers. In an example, a multiple quantum well active layer includes multiple well and barrier layers.

The term "active region" (or "active layer"), as used herein, refers to a light emitting region of a light emitting diode (LED) that is configured to generate light. An active layer includes an active material that generates light upon the recombination of electrons and holes. An active layer may include one or a plurality of layers. In some cases, an active layer includes a barrier layer (or cladding layer, such as, e.g., GaN) and a quantum well ("well") layer (such as, e.g., InGaN). In an example, an active layer comprises multiple quantum wells, in which case the active layer may be referred to as a multiple quantum well ("MQW") active layer.

The term "doped," as used herein, refers to a structure or layer that is doped with a doping agent. A layer may be doped with an n-type dopant (also "n-doped" herein) or a p-type dopant (also "p-doped" herein). In some cases, a layer is undoped or unintentionally doped (also "u-doped" or "u-type" herein). In an example, a u-GaN (or u-type GaN) layer includes undoped or unintentionally doped GaN.

The term "dopant," as used herein, refers to a doping agent, such as an n-type dopant or a p-type dopant. P-type dopants include, without limitation, magnesium, zinc and carbon. N-type dopants include, without limitation, silicon and germanium. A p-type semiconductor is a semiconductor that is doped with a p-type dopant. An n-type semiconductor is a semiconductor that is doped with an n-type dopant. An n-type Group III-V semiconductor includes a Group III-V semiconductor that is doped n-type, such as n-type gallium nitride ("n-GaN"). A p-type Group III-V semiconductor includes a Group III-V semiconductor that is doped p-type, such as p-type GaN ("p-GaN").

The term "adjacent" or "adjacent to," as used herein, includes 'next to', 'adjoining', 'in contact with', and 'in proximity to'. In some instances, adjacent components are separated from one another by one or more intervening layers. For example, the one or more intervening layers can have a thickness less than about 10 micrometers ("microns"), 1 micron, 500 nanometers ("nm"), 100 nm, 50 nm, 10 nm, 1 nm, or less. In an example, a first layer is adjacent to a second layer when the first layer is in direct contact with the second layer. In another example, a first layer is adjacent to a second layer when the first layer is separated from the second layer by a third layer.

The term "substrate," as used herein, refers to any workpiece on which film or thin film formation is desired. A substrate includes, without limitation, silicon, silica, sapphire, zinc oxide, carbon (e.g., graphene), SiC, AlN, GaN, spinel, coated silicon, silicon on oxide, silicon carbide on oxide, glass, gallium nitride, indium nitride, titanium dioxide, aluminum nitride, a metallic material (e.g., molybdenum, tungsten, copper, aluminum), and combinations (or alloys) thereof.

The term "injection efficiency," as used herein, refers to the proportion of electrons and holes passing through a light emitting device that are injected into the active region of the light emitting device.

The term "internal quantum efficiency," as used herein, refers to the proportion of all electron-hole recombination events in an active region of a light emitting device that are radiative (i.e., producing photons).

The term "extraction efficiency," as used herein, refers to the proportion of photons generated in an active region of a light emitting device that escape from the device.

The term "external quantum efficiency" (EQE), as used herein, refers to the ratio of the number of photons emitted from an LED to the number of electrons passing through the LED. That is, EQE=Injection efficiency x Internal quantum efficiency x Extraction efficiency.

LED's may be formed of various semiconductor device layers. In some situations, Group III-V semiconductor LED's offer device parameters (e.g., wavelength of light, external quantum efficiency) that may be preferable over other semiconductor materials. Gallium nitride (GaN) is a binary Group III-V direct bandgap semiconductor that may be used in optoelectronic applications and high-power and high-frequency devices.

Group III-V semiconductor based LED's may be formed on various substrates, such as silicon or sapphire. Silicon provides various advantages over other substrates, such as the capability of using current manufacturing and processing techniques, in addition to using large wafer sizes that aid in maximizing the number of LED's formed within a particular period of time. FIG. 1 shows an LED 100 having a substrate 105, an AlGaN layer 110 adjacent to the substrate 105, a pit generation layer 115 adjacent to the AlGaN layer 110, an n-type GaN ("n-GaN") layer 120 adjacent to the pit generation layer 115, an active layer 125 adjacent to the n-GaN layer 120, an electron blocking (e.g., AlGaN) layer 130 adjacent to the active layer 125, and a p-type GaN ("p-GaN") layer 135 adjacent to the electron blocking layer 130. The electron blocking layer 130 is configured to minimize the recombination of electrons with holes in the p-GaN layer 135. The substrate 100 may be formed of silicon. In some cases, the pit generation layer 115 comprises unintentionally doped GaN ("u-GaN").

While silicon provides various advantages, such as the ability to use commercially available semiconductor fabrication techniques adapted for use with silicon, the formation of a Group III-V semiconductor-based LED on a silicon substrate poses various limitations. As an example, the lattice mismatch and coefficient of thermal expansion between silicon and gallium nitride leads to structural stresses that generate defects upon the formation of gallium nitride thin films, such as threading and/or hairpin dislocations (collectively "dislocations" herein). Thin film growth around the defects produces V-defects (or V-pits), which are V-shaped or generally concave structures in device layers. Such V-pits make it difficult to achieve uniform device properties, such as the distribution of dopants in one or more layers.

Figure 2:
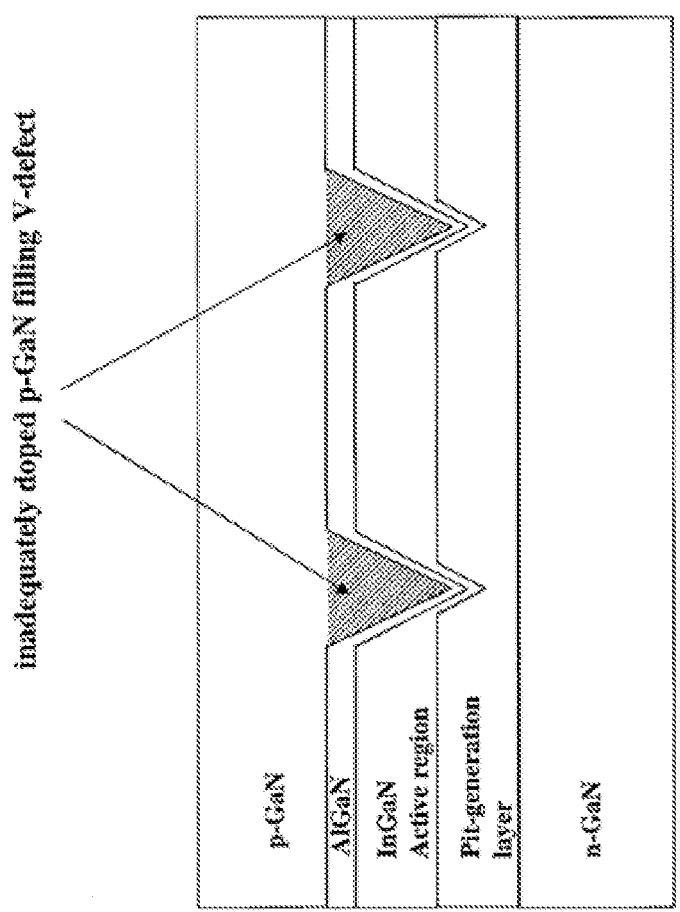
FIG. 2 schematically illustrates a light emitting diode with a region of inadequately doped p-type gallium nitride (p-GaN) filling V-defects of the active layer.

For instance, p-type doping of GaN grown within V-defect pits (collectively, "V-pits" herein) after the formation of an aluminum gallium nitride (AlGaN) layer may be insufficient to enable efficient hole emission from the material filling the V-defect in the active region. This problem may be due to the tendency of the p-type dopant (e.g., Mg) to segregate to the c-plane of an AlGaN surface as opposed to faceted V-defect AlGaN surfaces during thin film formation. The adsorption of the p-type dopant at V-defect faceted surfaces may be relatively insensitive to the gas phase p-type dopant precursor concentration. The incorporation of the p-type dopant takes place primarily along the c-plane surface. FIG. 2 shows an example of the resulting LED. The GaN material filling the pit is inadequately doped, resulting in poor device performance (e.g., low brightness, high power input) and/or non-uniform light output across the LED. That is, in cases in which the doping distribution of p-type dopant is non-uniform in the p-type GaN (p-GaN) layer, the electronic structure (or band diagram) of the LED may vary across the device, leading to a distribution of emitted light that is non-uniform. In the illustrated example, a portion of the p-type layer in the V-defects is undoped and therefore lacking a concentration of a p-type dopant (e.g., Mg) required for desirable (e.g., uniform) device performance. The portion of the p-type layer in the V-pits is inadequately doped, having a p-type dopant concentration that is less than the concentration of the p-type dopant in the p-GaN layer outside of the V-pits. In an example, the p-GaN layer in the V-pits has a p-type dopant concentration that is at most 1%, or 10%, or 20%, or 30%, or 40%, or 50%, or 60%, or 70%, or 80%, or 90%, or 95% that of the concentration of the p-type dopant in the p-GaN layer outside of the V-pits.

Figure 3:
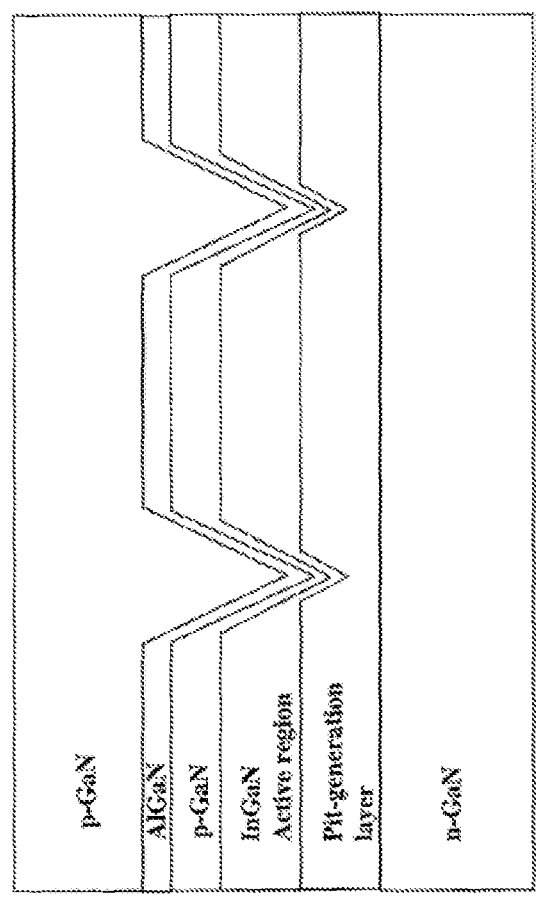
FIG. 3 schematically illustrates a light emitting diode having a p-GaN layer adjacent to an active layer.

An approach for addressing such issues includes growing p-GaN with a low concentration of indium directly on the V-defect pitted active region before the AlGaN, thereby reducing the problem of p-type dopant (e.g., Mg) segregation on an AlGaN surface. A light emitting device having such a structure is shown schematically in FIG. 3. Although hole injection efficiency is achieved, at least some of the benefit derived by having an intervening electron blocking layer between the active layer and the p-GaN may be lost.

Another approach for addressing such issues is to minimize the concentration of V-pits in the LED. For example, the active layer may be formed with low or substantially low defect densities, which may aid in minimizing the coverage (or density) of V-pits. Such an approach, however, may be commercially infeasible and/or difficult to implement with methods currently available for forming LED's. For instance, the formation of LED component layers (e.g., active layer) at low defect densities may be a slow and resource intensive process, leading to high processing costs and inadequate device turnover to meet the commercial demand for LED devices.

Provided herein are device structures and methods for reducing, if not eliminating, the issues with inadequate dopant concentrations in V-pits. Devices and methods provided herein advantageously preclude the need for forming LED component layers with low defect densities by compensating for the issues of poor and/or non-uniform dopant concentrations in various LED component layers.

Light emitting devices and methods described in various embodiments of the invention address the problem of inefficient p-type doping in V-pits due to p-type dopant segregation to the c-plane of an AlGaN surface during the formation of the p-GaN layer. Methods and structures described herein provide for high hole injection efficiency without a p-type semiconductor layer below the AlGaN electron blocking layer (see FIG. 3).

Light Emitting Devices

In an aspect of the invention, light emitting device structures are provided having improved dopant concentrations in V-pits. Such device structures minimize or preclude the need to form light emitting device structures with minimal defect densities. With the aid of structures provided herein, device structures with relatively moderate defect densities (and hence V-pits) may be used, which advantageously reduces processing costs.

In some embodiments, a light emitting device, such as a light emitting diode (LED), comprises a first layer of one of an n-type Group III-V semiconductor and a p-type Group III-V semiconductor, an active layer adjacent to the first layer, and a second layer of the other of the n-type Group III-V semiconductor and the p-type Group III-V semiconductor adjacent to the active layer. The n-type Group III-V semiconductor comprises a Group III-V semiconductor that is doped with an n-type dopant. The p-type Group III-V semiconductor comprises a Group III-V semiconductor that is doped with a p-type dopant. The active layer includes one or more V-pits. The second layer has a first portion and a second portion laterally bounded by the one or more V-pits. The first portion is disposed over the active layer. The second portion has a uniform concentration of an n-type or p-type dopant. In an example, the Group III-V semiconductor is gallium nitride. In some embodiments, the active layer has a defect density between about $1\times10^8$ cm$^{-2}$ and $5\times10^9$ cm$^{-2}$. In other embodiments, the active layer has a defect density between about $1\times10^9$ cm$^{-2}$ and $2\times10^9$ cm$^{-2}$.

The Group III-V semiconductor includes a Group III species and a Group V species. In some embodiments, the Group III species is gallium and the Group V species is nitrogen. In some embodiments, the Group III species includes gallium and/or indium. In other embodiments, the Group III species includes gallium, indium and/or aluminum.

In some embodiments, a light emitting device includes an n-type gallium nitride (GaN) layer having an n-type dopant. The n-GaN layer is disposed adjacent to an active layer that has one or more V-pits. That is, the active layer, as formed, exhibits one or more V-shaped pits (or defects). The active layer is adjacent to a p-type GaN layer having a p-type dopant. The p-GaN layer has a first portion and a second portion. The second portion is laterally bounded by the one or more V-pits. The first portion is disposed over the active layer and not laterally bounded by the one or more V-pits. In an embodiment, the light emitting device is a nascent light emitting device, requiring additional processing and/or device structures to reach completion.

In some cases, the p-GaN layer has a thickness ranging between about 10 nanometers ("nm") and 1000 nm. In other embodiments, the p-GaN layer has a thickness ranging between about 50 nm and 500 nm. The thickness of the p-GaN layer may be selected so as to provide a light emitting device having predetermined operating conditions.

In some cases, the n-GaN layer has a thickness ranging between about 100 nm and 8 micrometers ("microns"), whereas in other embodiments the thickness of the n-GaN layer ranges between about 500 nm and 6 microns. In yet other embodiments, the thickness of the n-GaN layer ranges between about 1 micron and 4 microns. The thickness of the n-GaN layer may be selected so as to provide a light emitting device having predetermined operating conditions.

In an embodiment, the p-type dopant includes one or more of magnesium, carbon and zinc. In a particular implementation, the p-type dopant is magnesium.

In an embodiment, the n-type dopant includes one or more of silicon and germanium. In a particular implementation, the n-type dopant is silicon.

In some situations, the p-GaN layer further comprises a wetting material that aids in the doping of the p-GaN layer. The wetting material in some cases enables the p-type dopant to uniformly distribute across a layer of the wetting material prior to the formation of the p-GaN layer (see below). In some situations, the wetting material is indium (In).

In some embodiments, the second portion has a uniform concentration of the p-type dopant. In some cases, the concentration of the p-type dopant in the second portion is nearly or substantially equal to the concentration of the p-type dopant (or another p-type dopant) in the first portion of the p-GaN layer. In an embodiment, the concentration of the p-type dopant in the second portion is within about 90%, or 80%, or 70%, or 60%, or 50%, or 40%, or 30%, or 20%, or 10%, or 5%, or 1%, or 0.1%, or 0.01%, or 0.001% of the concentration of the p-type dopant in the first portion.

In an embodiment, the second portion is substantially doped with a p-type dopant. The concentration of the p-type dopant in the first portion and the second portion is between about $1\times10^{18}$ cm$^{-3}$ and $1\times10^{22}$ cm$^{-3}$. In other embodiments, the concentration of the p-type dopant in the first portion and the second portion is between about $1\times10^{19}$ cm$^{-3}$ and $1\times10^{21}$ cm$^{-3}$, while in other embodiments, the concentration of the p-type dopant in the first portion and the second portion is between about $1\times10^{20}$ cm$^{-3}$ and $5\times10^{20}$ cm$^{-3}$.

In other situations, the concentration of the p-type dopant in the first portion is at a maximum at or near the active layer and decreases toward the second portion. In other situations, the concentration of the p-type dopant in the first portion is uniform or substantially uniform along a direction parallel to a surface between the p-GaN layer and the active layer (also "lateral axis" herein) and along a direction orthogonal to a surface between the p-GaN layer and the active layer (also "longitudinal axis" herein).

In a particular implementation, the concentration of the p-type dopant in the second portion is uniform along a longitudinal dimension of the V-pits. In some embodiments, the concentration of the p-type dopant in the V-pits, as measured along a longitudinal axis of the light emitting device, varies by at most about 50%, or 40%, or 30%, or 20%, or 10%, or 5%, or 1%, or 0.1%, or 0.01%, or 0.001%, or 0.0001%. In other cases, the concentration of the p-type dopant in the second portion is uniform along a lateral dimension of the V-pits. In some embodiments, the concentration of the p-type dopant in the V-pits, as measured along a lateral axis of the light emitting device, varies by at most about 50%, or 40%, or 30%, or 20%, or 10%, or 5%, or 1%, or 0.1%, or 0.01%, or 0.001%, or 0.0001%.

The light emitting device further comprises a substrate adjacent to the n-type or p-type GaN layer. In an example, the substrate includes silicon, such as n-type silicon for example, or sapphire. In some cases, the substrate is for use in the completed light emitting device. In other cases, the substrate is a carrier substrate and the completed light emitting device, in such cases, will include another substrate. In some embodiments, the substrate has a thickness ranging between about 200 micrometers (um) and 2 millimeters (mm).

In some embodiments, the light emitting device includes a pit generation layer. In some cases, the pit generation layer is adjacent to the n-type GaN layer, such as below the n-type GaN layer and the active layer. In other cases, the pit generation layer is between the n-type GaN layer and the active layer. The pit generation layer aids in the growth of the one or more V-pits during the formation of the active layer and, in some cases, other layers formed over the active layer.

In some embodiments, the pit generation layer has a defect density between about $1'10^8$ cm$^{-2}$ and $5\times10^9$ cm$^{-2}$, while in other embodiments pit generation layer has a defect density between about $1\times10^9$ cm$^{-2}$ and $2\times10^9$ cm$^{-2}$. In some embodiments, the pit generation layer has a thickness between about 10 nm and 1000 nm, while in other embodiments, the pit generation layer has a thickness between about 50 nm and 500 nm.

The light emitting device includes an electrode in electrical communication with the n-GaN layer by direct contact with the n-GaN layer or through one or more intervening layers. The light emitting device further includes an electrode in electrical communication with (or electrically coupled to) the p-GaN layer by direct contact with the p-GaN layer or through one or more intervening layers. In some cases, one or both of the electrodes have shapes and configurations (e.g., location on the light emitting device) selected to minimize the obstruction of light emanating from the light emitting device.

The active layer may be a quantum well active layer, such as a multiple quantum well (MQW) active layer. In an embodiment, the active layer comprises a well layer formed of indium gallium nitride and/or indium aluminum gallium nitride. The material comprising the active layer may be compositionally graded (also "graded" herein) in two or more elements comprising the active layer. In an example, the active layer is formed of graded indium gallium nitride, $In_xGa_{1-x}N$, wherein 'x' is a number between 0 and 1, and a barrier (or cladding) layer formed of GaN. The composition of such a layer may vary from a first side to a second side of the layer. In some embodiments, the well or barrier material is selected from gallium nitride, various compositions (or stoichiometries) of InAlGaN and various compositions of AlGaN. In some embodiments, the active layer has a thickness between about 10 nm and 1000 nm, while in other embodiments, the active layer has a thickness between about 50 nm and 200 nm.

In some embodiments, the active layer has a defect density between about $1\times10^8$ cm$^{-2}$ and $5\times10^9$ cm$^{-2}$ while in other embodiments, the active layer has a defect density between about $1\times10^9$ cm$^{-2}$ and $2\times10^9$ cm$^{-2}$. In other embodiments, the active layer has a defect density greater than about $1\times10^6$ cm$^{-2}$, or greater than about $1\times10^7$ cm$^{-2}$, or greater than about $1\times10^8$ cm$^{-2}$, or greater than about $1\times10^9$ cm$^{-2}$.

In some embodiments, the thickness of the light emitting device between the n-GaN layer and the p-GaN layer is less than about 4 microns, or less than about 3 microns, or less than about 2 microns, or less than about 1 micron, or less than about 500 nm. The region between the n-GaN layer and the p-GaN layer includes the active layer.

The light emitting device in some cases includes an electron blocking layer between the active layer and the p-GaN layer. The electron blocking layer is configured to minimize the recombination of electrons and holes in the p-GaN layer, which may not desirable if optical emission in the active layer is desired. In an example, the electron blocking layer is formed of aluminum gallium nitride or aluminum indium gallium nitride. The electron blocking layer may be compositionally graded (also "graded" herein) in two or more elements of the electron blocking layer. For instance, the electron blocking layer may be formed of graded aluminum gallium nitride, $Al_xGa_{1-x}N$, wherein 'x' is a number between 0 and 1, or $Al_xIn_yGa_{1-x-y}N$, wherein 'x' and 'y' are numbers between 0 and 1. The composition of such a layer may vary from a first side to a second side of the layer. In some embodiments, the electron blocking layer has a thickness between about 1 nm and 1000 nm, or between about 10 nm and 100 nm.

In some embodiments, the light emitting device further includes a p-type dopant injection layer between the active layer and the p-GaN layer. The p-type dopant injection layer is configured to provide a p-type dopant to the second portion of the p-GaN layer during the formation of the p-GaN layer. The p-type dopant injection layer advantageously aids in providing a desirable or predetermined concentration of a p-type dopant in the V-pits, which aids in minimizing, if not eliminating, issues with inadequately doped regions of the p-GaN layer. The p-type dopant injection layer includes a p-type dopant and, in some cases, a wetting material. In some embodiments, the p-type dopant is magnesium (Mg). In some embodiments, the wetting material is indium (In). The wetting material is configured to enable the p-type dopant to uniformly cover the p-type dopant injection layer. In some cases, the wetting material may remain at the interface between the p-GaN layer and the electron blocking layer or active layer (if the electron blocking layer is precluded).

In some embodiments, the p-type dopant injection layer has a thickness that is less than about 100 nm, or less than about 50 nm, or less than about 10 nm, or less than about 1 nm, or less. In some cases, the thickness of the p-type dopant injection layer is described in terms of monoatomic monolayers (ML). In some embodiments, the thickness of the p-type dopant injection layer is between about 0.1 ML and 10 ML. In other embodiments, the p-type dopant injection layer has a thickness less than or equal to about 10 ML, or less than or equal to about 5 ML, or less than or equal to about 4 ML, or less than or equal to about 3 ML, or less than or equal to about 2 ML, or less than or equal to about 1 ML, or less than or equal to about 0.5 ML, or less.

In some embodiments, a light emitting diode (LED) includes an n-type gallium nitride (GaN) layer, an active layer adjacent to said n-type GaN layer, and a p-type GaN layer adjacent to the active layer. The active layer includes one or more V-pits. The p-type GaN layer includes a first portion and a second portion. The second portion is laterally bounded by the one or more V-pits. The first portion is disposed over the active layer and has a p-type dopant concentration of at least about $1\times10^{18}$ cm$^{-3}$, or at least about $1\times10^{19}$ cm$^{-3}$, or at least about $1\times1$ $0^{20}$ cm$^{-3}$, or at least about $1\times10^{21}$ cm$^{-3}$, or at least about $1\times10^{22}$ cm$^{-3}$. In some cases, the concentration of the p-type dopant is between about $1\times10^{18}$ cm$^{-3}$ and $1\times10^{22}$ cm$^{-3}$, or between about $1\times10^{19}$ cm$^{-3}$ and $1\times10^{21}$ cm$^{-3}$, or between about $1\times10^{20}$ cm$^{-3}$ and $5\times10^{20}$ cm$^{-3}$.

In some embodiments, a light emitting diode (LED) includes a first layer of one of n-type gallium nitride (GaN) and p-type GaN, and an active layer adjacent to the first layer, the active layer having one or more V-pits. The LED further includes a second layer of the other of the n-type GaN and p-type GaN, the second layer having a first portion and a second portion laterally bounded by the one or more V-pits. The first portion is disposed over the active layer. The second portion has a uniform concentration of an n-type or p-type dopant.

Figure 4:
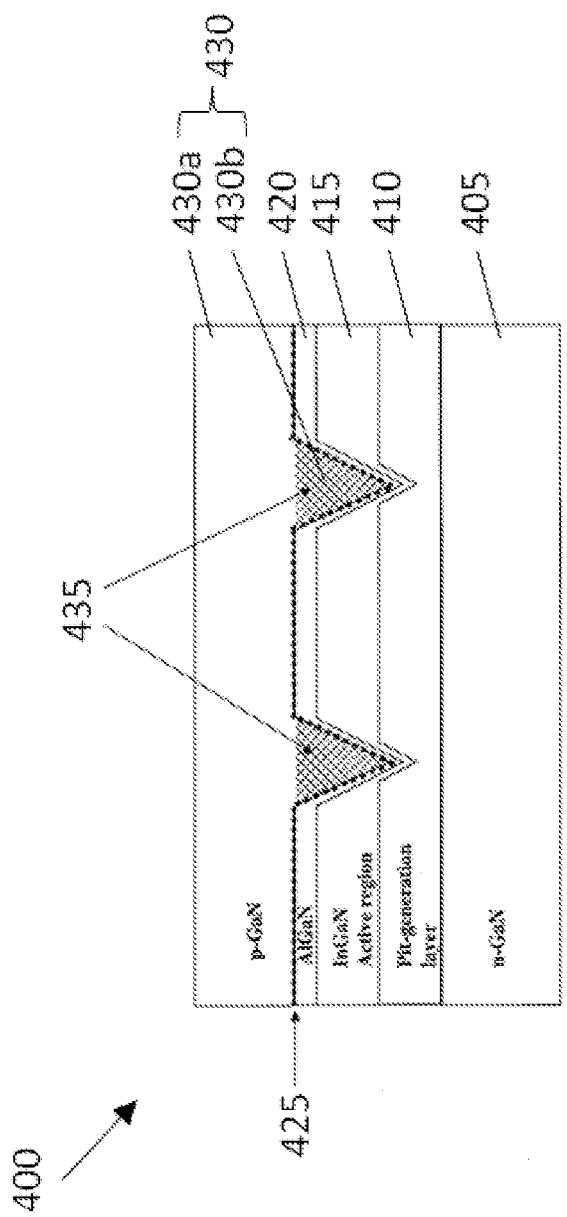
FIG. 4 schematically illustrates a light emitting device with a delta doped layer, in accordance with an embodiment.

FIG. 4 schematically illustrates a light emitting device ("device") 400, in accordance with an embodiment of the invention. In an example, the light emitting device 400 is a light emitting diode. The light emitting device 400 includes, from bottom to top, an n-doped (or "n-type") GaN layer ("n-GaN layer") 405, a pit generation layer 410 adjacent to the n-GaN layer 405, an active layer 415 adjacent to the pit generation layer 410, an electron blocking layer 420 adjacent to the active layer 415, a p-type dopant injection layer 425 adjacent to the electron blocking layer 420, and a p-GaN layer 430 adjacent to the p-type dopant injection layer 425. The device 400 includes a plurality of V-pits 435 (two shown), which form from defects (e.g., dislocations) in the material layers upon the layer-by-layer formation of the pit generation layer 410, the active layer 415 and the electron blocking layer 420. The p-GaN layer 430 includes a first portion 430a and a second portion 430b, the second portion 430b is disposed in the V-pits 435. The p-type dopant injection layer includes a p-type dopant and, in some cases, a wetting material. The p-type dopant injection layer aids in forming the second portion 430b with a desirable (or predetermined) uniformity, distribution and/or concentration of the p-type dopant in the second portion 430b.

In some embodiments, the active layer 415 is a multiple quantum well active layer. In an embodiment, the active layer is formed of alternating layers of a well layer and a barrier layer, such as alternating layers of indium gallium nitride and gallium nitride, or alternating layers of indium aluminum gallium nitride and gallium nitride. Gallium nitride in both cases may serve as the barrier layer material. Indium gallium nitride or indium aluminum gallium nitride may serve as a well layer material.

In an example, the active layer 415 is formed of alternating aluminum gallium nitride layers and gallium nitride layers, the electron blocking layer 420 is formed of aluminum gallium nitride, and the p-type dopant injection layer 425 is formed of magnesium and indium. Indium in such a case serves as the wetting material. Alternatively, the electron blocking layer 420 is formed of a quaternary material, such as aluminum indium gallium nitride. In some cases, the electron blocking layer 420 is compositionally graded. In other cases, the electron blocking layer 420 has a uniform composition.

The device 400 is formed on a substrate (not shown). The substrate is disposed adjacent to the n-GaN layer 405 or adjacent to the p-GaN layer 430. In an embodiment, the substrate is formed of silicon or sapphire. In some cases, the substrate is disposed adjacent to the n-GaN layer 405, and a buffer layer having an AlN layer and an AlGaN layer is formed between the substrate and the n-GaN layer 405. The AlN layer is disposed adjacent to the substrate, and the AlGaN layer is disposed adjacent to the AlN layer and the n-GaN layer 405.

In an implementation, the substrate is formed of silicon disposed adjacent to the n-GaN layer 405. The substrate may be used to transfer the layers 405-430 to another substrate, such as silicon. In such a case, with the layers 405-430 formed on a first substrate disposed adjacent to the n-GaN layer, after transfer, the layers 405-430 are disposed on a second substrate adjacent to the p-GaN layer.

Figure 5:
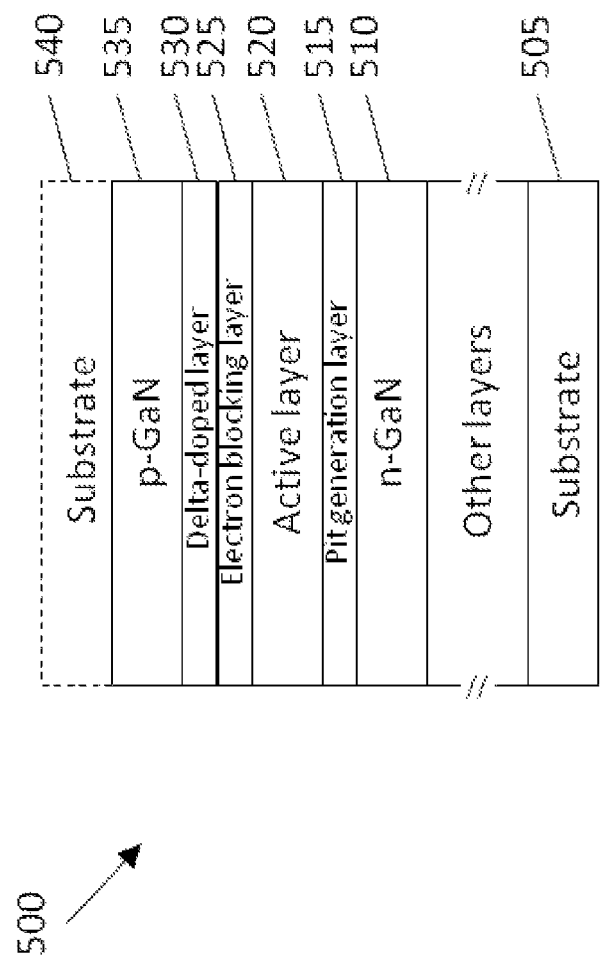
FIG. 5 schematically illustrates a light emitting device with a delta doped layer and other device layers, in accordance with an embodiment.

FIG. 5 schematically illustrates a device 500 having a plurality of layers 510-535 formed on a substrate 505, in accordance with an embodiment of the invention. The device 500 is a light emitting device, such as a light emitting diode. The device 500 includes, from bottom to top (with "bottom" designating a location adjacent to the substrate 505), an n-GaN layer 510, a pit generation layer 515, an active layer 520, an electron blocking layer 525, a delta doped layer 530, and a p-GaN layer 535. The p-GaN layer 535 includes a first portion and a second portion (not shown). The second portion is formed in one or more V-pits in the pit generation layer 515, the active layer 520 and the electron blocking layer 525 (see, e.g., FIG. 4). The delta-doped layer 530 includes a p-type dopant, such as magnesium, and a wetting material, such as indium. In some situations, the wetting material decreases the barrier to migration of a p-type dopant on a surface of the delta-doped layer, enabling the p-type material to uniformly cover the delta-doped layer. The wetting material may reduce the surface energy of the p-type dopant (e.g., Mg) on the V-defect. As described below, the p-type dopant is provided in the delta doped layer 530 by pulsing a source gas of the p-type dopant into a reaction chamber having the substrate 505.

In an example, the delta doped layer 530 includes a wetting material, such as indium, which reduces the surface energy of a p-type dopant (e.g., Mg) on the V-defect facets, thereby aiding in the incorporation of the p-type dopant into the wetting layer. The p-type dopant in the delta doped layer 530 provides a source of the p-type dopant for subsequent incorporation into a portion of the GaN layer in one or more V-pits of the active layer 520 and the electron blocking layer 525. This facilitates the formation of the portion of the p-GaN layer 535 in the one or more V-pits.

In some embodiments, the device 500 includes a first electrode in electrical communication with the n-GaN layer 510 and a second electrode in electrical communication with the p-GaN layer 535. The electrodes enable the application of an electrical potential (voltage) across the active layer 520. In some situations, the first and second electrodes are in electrical contact with the n-GaN layer 510 and the p-GaN layer 535, respectively. In other cases, one or both of the first and second electrodes are in electrical contact with the n-GaN layer 510 and the p-GaN layer 535 through one or more intervening layers. In an example, the second electrode is in electrical communication with the p-GaN layer through a transparent conductive layer (not shown), such as, for example, an indium tin oxide (ITO) layer.

The recombination of electrons and holes in the active layer 520, such as upon the application of an electrical potential across the active layer 520, generates light which is transmitted out of the device in a direction generally away from the substrate 505. As an alternative, the layers 505-535 are transferred to another substrate 540 and the substrate 505 is subsequently removed. The recombination of electrons and holes in the active layer 520 generates light, which is subsequently transmitted out of the device 500 through the n-GaN layer and along a direction generally away from the substrate 540. In some cases, the device 500 includes additional layers between the p-GaN layer 535 and the substrate 540.

In some embodiments, the substrate 505 is formed of one or more of silicon, silica, sapphire, zinc oxide, carbon (e.g., graphene), SiC, AlN, GaN, spinel, coated silicon, silicon on oxide, silicon carbide on oxide, glass, gallium nitride, indium nitride, titanium dioxide, aluminum nitride, a metallic material (e.g., copper), and combinations (or alloys) thereof. In some situations, the substrate 505 is formed of silicon. In an example, the substrate 505 can be formed of n-type silicon. In such a case, an electrode may be formed in contact with the substrate 505 that is in electrical communication with the n-GaN layer 510.

The device 500, in some cases, includes one or more additional layers between the substrate 505 and the n-GaN layer 510. The one or more additional layers may include buffer layers, stress relaxation layers, or stress generation layers. In an embodiment, the device 500 includes an aluminum gallium nitride layer adjacent to the substrate, and one or more u-type GaN (i.e., undoped or unintentionally doped GaN) layers adjacent to the aluminum gallium nitride layer. The one or more u-GaN layers are disposed adjacent to the n-GaN layer 510.

In some situations, the electron blocking layer 525 is formed of aluminum gallium nitride (AlGaN). In some cases, the AlGaN layer can be compositionally graded in aluminum and gallium.

In some embodiments, the delta doped layer 530 is at an interface between the electron blocking layer 525 and the p-GaN layer 535. In some cases, at the interface between the electron blocking layer 525 and the p-GaN layer 535, the device 500 has a secondary ion mass spectrometry (SIMS) profile exhibiting coincident Mg and In peaks.

In some cases, as measured by SIMS, the peak indium intensity observed within the delta-doped layer 530 is on the order of 1/100th or less than the peak indium intensity (or concentration) observed in the individual quantum wells within the active layer 520. The position of the peak indium concentration coincides with that of the peak magnesium concentration at the interface between the AlGaN layer and the p-GaN layer 535.

In some embodiments, a light emitting device with V-pits (or V-defects) has a uniform distribution of a p-type dopant in a p-GaN layer of the light emitting device. This advantageously enables the use of device structures (e.g., active layer) with moderate to high defect densities, while minimizing, if not eliminating, the issues with such device structures provided herein, such as non-uniform dopant concentrations.

Methods for Forming Light Emitting Devices

In another aspect of the invention, methods for forming a light emitting device are provided. Such methods provide for the formation of devices described herein, such as light emitting diodes, including Group III-V LED's (e.g., GaN-based LED's).

In some embodiments, a method for forming a light emitting device, such as a light emitting diode (LED), includes forming, over a substrate in a reaction chamber, a p-type Group III-V semiconductor layer over (or adjacent to) an active layer, the p-type Group III-V semiconductor layer extending into one or more V-pits of the active layer, including any intervening layers between the p-type Group III-V semiconductor layer and the active layers (e.g., an electron blocking layer). The p-type Group III-V semiconductor layer is formed by delta doping a wetting layer with a p-type dopant, and introducing a Group III source gas and a Group V source gas into the reaction chamber. A source gas of a p-type dopant is introduced to control the concentration of the p-type dopant in the p-type Group III-V layer. The active layer is formed over (or adjacent to) an n-type Group III-V semiconductor layer. The Group III-V semiconductor layer is formed by introducing a Group III source gas, a Group V source gas and a source gas of an n-type dopant into the reaction chamber.

The p-type Group III-V semiconductor layer includes a Group III-V semiconductor and a p-type dopant. The n-type Group III-V semiconductor layer includes a Group III-V semiconductor and an n-type dopant. A Group III-V semiconductor includes a Group III species and a Group V species. In an embodiment, a Group III species is gallium and/or indium. In another embodiment, a Group V species is nitrogen.

In some embodiments, a method for forming a light emitting device, such as an LED, includes forming, over a substrate in a reaction chamber, a p-type Group III-V semiconductor layer adjacent to an active layer, the p-type Group III-V semiconductor layer extending into one or more V-pits of the active layer. The p-type Group III-V semiconductor layer is formed by delta doping a wetting layer with a p-type dopant and introducing a source gas of a Group III species and a source gas of a Group V species into the reaction chamber. The wetting layer is formed adjacent to the active layer. In some situations, prior to forming the wetting layer, an electron blocking layer is formed adjacent to the active layer. In an embodiment, the active layer is formed adjacent to an n-type Group III-V semiconductor layer. In another embodiment, the n-type Group III-V semiconductor layer is formed adjacent to the substrate.

In a particular implementation, a method for forming a light emitting diode (LED) comprises forming, over a substrate in a reaction chamber, a p-type gallium nitride (p-GaN) layer over (or adjacent to) an active layer, the p-GaN layer extending into one or more V-pits of the active layer, including any intervening layers between the p-GaN layer and the active layers (e.g., an electron blocking layer). The p-GaN layer is formed by delta doping a wetting layer with a p-type dopant, and introducing a gallium source gas and a nitrogen source gas into the reaction chamber. A source gas of a p-type dopant is introduced to control the concentration of the p-type dopant in the p-GaN layer.

In an embodiment, the wetting layer is formed adjacent to the active layer. In some cases, the light emitting device includes an electron blocking layer formed between the wetting layer and the active layer. In some situations, prior to forming the wetting layer, an electron blocking layer is formed adjacent to the active layer. The active layer is formed over (or adjacent to) an n-type GaN ("n-GaN") layer. The n-GaN layer is formed over (or adjacent to) the substrate.

In other embodiments, a method for forming a light emitting diode (LED) includes forming an n-GaN layer adjacent to a substrate in a reaction chamber, forming an active layer over the substrate, forming an electron blocking layer over the active layer, and forming a delta-doped layer over the electron blocking layer. The delta-doped layer is formed by delta doping a wetting layer with a p-type dopant.

In some situations, delta doping the wetting layer includes pulsing a precursor of the p-type dopant into a reaction chamber having the substrate. The precursor of the p-type dopant is pulsed for a duration between about 0.01 seconds and 20 minutes, or between about 0.1 seconds and 15 minutes, or between about 1 second and 10 minutes.

Figure 6:
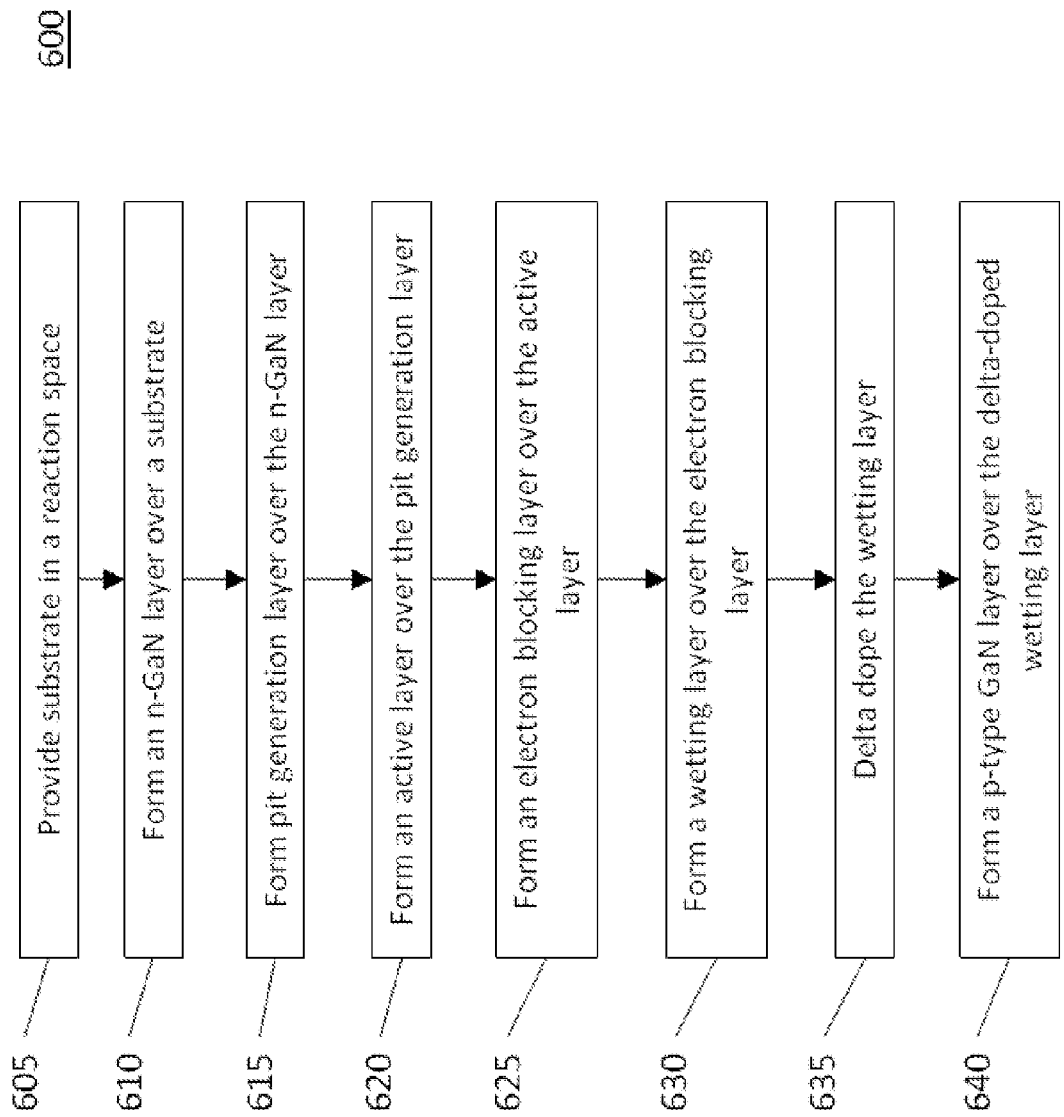
FIG. 6 shows a method for forming a light emitting device, in accordance with an embodiment.

FIG. 6 schematically illustrates a method 600 having a process flow diagram for forming a light emitting device, in accordance with an embodiment of the invention. In a first operation 605, a substrate is provided in a reaction chamber configured for growth of one or more device structures (or layers) of the light emitting device. In an example, the reaction chamber is a chamber under vacuum or an inert gas environment.

For instance, the reaction chamber may be a vacuum chamber, such as an ultrahigh vacuum (UHV) chamber. In cases in which a low-pressure environment is desired, the reaction chamber may be pumped with the aid of a pumping system having one or more vacuum pumps, such as one or more of a turbomolecular ("turbo") pump, a cryopump, an ion pump and a diffusion pump and a mechanical pump. The reaction chamber may include a control system for regulating precursor flow rates, substrate temperature, chamber pressure, and the evacuation of the chamber.

Next, in a second operation 610, an n-GaN layer is formed over the substrate. In an embodiment, the n-GaN layer is formed by directing into the reaction chamber a gallium precursor, a nitrogen precursor, and a precursor of an n-type dopant. The gallium precursor includes one or more of trimethylgallium (TMG), triethylgallium, diethylgallium chloride and coordinated gallium hydride compounds (e.g., dimethylgallium hydride). The nitrogen precursor includes one or more of ammonia ($NH_3$), nitrogen ($N_2$), and plasma-excited species of ammonia and/or $N_2$. In some cases, the precursor of the n-type dopant is silane.

In an embodiment, the gallium precursor, the nitrogen precursor and the precursor of the n-type dopant are directed into the reaction chamber simultaneously. In another embodiment, the gallium precursor, the nitrogen precursor and the precursor of the n-type dopant are directed into the reaction chamber (e.g., pulsed) in an alternating and sequential basis.

Next, in an optional third operation 615, a pit generation layer is formed over the n-GaN layer. The pit generation layer is formed by directing into the reaction chamber a gallium precursor and a nitrogen precursor, and in some cases an indium precursor. The pit generation layer in some situations is formed of GaN, InGaN, and various combinations thereof, including an InGaN/GaN superlattice. In some cases, the pit generation layer is optional if one or more sub-layers of a multiple quantum well active layer are used to create pits.

Next, in a fourth operation 620, an active layer is formed over the n-GaN layer or the pit generation layer (if formed in operation 615). In an example, the active layer is a multiple quantum well active layer comprising alternating InGaN well layers and GaN barrier layers. The active layer is formed by during a gallium source gas and a nitrogen source gas into the reaction chamber to form a barrier layer, and introducing an indium source gas to form a well layer. The indium source gas includes one or more of trimethylindium, triethylindium, diethylindium chloride and coordinated indium hydride compounds (e.g., dimethylindium hydride). The source gases for forming the individual barrier and well layers are directed into the reaction chamber simultaneously or, in other cases, alternately and sequentially.

Next, in a fifth operation 625, an electron blocking layer is formed over the active layer. In cases in which the electron blocking layer includes aluminum gallium nitride, the electron blocking layer is formed by directing into the reaction chamber a gallium source gas, a nitrogen source gas and an aluminum source gas. In some situations, the aluminum source gas includes one or more of tri-isobutyl aluminum (TIBAL), trimethyl aluminum (TMA), triethyl aluminum (TEA), and dimethylaluminum hydride (DMAH). In some situations, the electron blocking layer includes aluminum indium gallium nitride, in which case an indium source gas, such as trimethylindium (TMI), may be used in conjunction with other source gases. In other embodiments, the electron blocking layer in some cases is precluded.

Next, in a sixth operation 630, a wetting layer is formed over the electron blocking layer (or the active layer if the electron blocking layer is precluded). The wetting layer is formed by directing into the reaction chamber a source gas of a wetting material, such as trimethylindium (TMI) if the wetting material is indium.

Next, in a seventh operation 635, the wetting layer is contacted with a source gas of a p-type dopant. In an implementation, the wetting layer is delta doped by pulsing into the reaction chamber the source gas of the p-type dopant. Delta doping the wetting layer forms a delta doped layer. In some cases, the delta doped layer is a p-type dopant injection layer. In an example, the p-type dopant is magnesium, and the wetting layer is delta doped with magnesium by directing into the reaction chamber biscyclopentadienyl magnesium (Cp2Mg).

In an example, the wetting layer is formed at operation 630 at a first temperature and in operation 635 the wetting layer is delta doped at the same or similar temperature to form the delta doped layer. However, in other cases, the wetting layer is formed at a first temperature, and the wetting layer is delta doped with a p-type dopant at a second temperature that is different from the first temperature. In an embodiment, the wetting layer and/or the delta doped layer are formed at a temperature between about 700° C. and 1100° C. In other embodiments, the wetting layer and/or the delta doped layer are formed at a temperature between about 800° C. and 1050° C., while in other embodiments, the wetting layer and/or the delta doped layer are formed at a temperature between about 850° C. and 1000° C.

In an example, the wetting layer is delta doped by pulsing into the reaction chamber a source gas of a p-type dopant. In an embodiment, the source gas of the p-type dopant is pulsed for a duration between 0.01 seconds and 20 minutes. In other embodiments, the source gas of the p-type dopant is pulsed for a duration between about 0.1 seconds and 15 minutes, while in other embodiments, the source gas of the p-type dopant is pulsed for a duration between about 1 second and 10 minutes.

In the illustrated example, operation 635 follows operation 630. In some cases, however, operations 630 and 635 are performed simultaneously. That is, the source gas of the wetting material and the source gas of the p-type dopant are directed into the reaction chamber simultaneously. In an example, trimethylindium (TMI), biscyclopentadienyl magnesium (Cp2Mg) and ammonia are directed into the reaction chamber with the aid of an $N_2$ carrier gas and brought in contact with the electron blocking layer (e.g., AlGaN) formed in operation 625. The Cp2Mg may be flowed before, concurrently, or after providing TMI into the reaction chamber. In an example, operation 635 precedes operation 630—that is, the electron blocking layer is contacted with the source of the p-type dopant (e.g., Cp2Mg) to form a layer of a p-type dopant over the electron blocking layer, which is subsequently contacted with the source gas of the wetting material (e.g., TMI).

Next, in an eight operation 640, a p-type gallium nitride (p-GaN) layer is formed over (or adjacent to) the delta doped layer. In some embodiments, no actual growth of the p-GaN layer occurs during the formation of the delta doped layer.

The p-GaN layer is formed by directing into the reaction chamber a gallium source gas (or precursor) and a nitrogen source gas. In an embodiment, a source gas of a p-type dopant is not directed into the reaction chamber with the gallium source gas and the nitrogen source gas. In such a case, upon bringing the gallium source gas and the nitrogen source gas in contact with the delta doped layer, a GaN layer begins to form on the delta-doped layer. Growth of the GaN layer is accompanied by the incorporation of the p-type dopant from the delta doped layer into the GaN layer, thereby forming the p-GaN layer, which is accompanied by a depletion of the delta doped layer in the p-type dopant. At a predetermined period of time, a source gas of a p-type dopant is introduced into the reaction chamber to continue the formation of the p-GaN layer. In some cases, the source gas of the p-type dopant is accompanied by a continuing flow of gallium source gas and nitrogen source gas. The delta doped layer enables doping of the GaN layer (to form p-GaN) in one or more V-pits of the active layer and the electron blocking layer. Subsequent introduction of the source gas of the p-type dopant provides the p-type dopant for continual growth of the p-GaN layer in a portion of the p-GaN layer over the active layer (and not in the V-pits).

In an example, a p-GaN layer includes a first portion and a second portion (see, e.g., FIG. 4). The first portion is disposed over the electron blocking layer outside of the one or more V-pits, and the second portion is formed in the one or more V-pits. During growth of the second portion, the p-type dopant for the p-GaN layer is provided by the delta doped layer. Following formation of the second portion, a source gas of the p-type dopant (or a source gas of another p-type dopant) is introduced to provide a predetermined concentration of the p-type dopant in the first portion.

In some situations, source gases are directed into the reaction chamber with the aid of a carrier gas and/or pumping. The carrier gas may be an inert gas, such as $H_2$, Ar and/or $N_2$. In an example, a gallium source gas (e.g., TMG) and a nitrogen source gas (e.g., $NH_3$) are directed into the reaction chamber with the aid of $N_2$. In another example, a gallium source gas, a nitrogen source gas and a source gas of a p-type dopant are directed into the reaction chamber with the aid of a pumping system (e.g., turbo pump).

The reaction chamber between some or all of the individual operations may be evacuated. In some cases, the reaction chamber is purged with the aid of a purge gas or a vacuum (pumping) system. In an example, the reaction chamber between operations 620 and 625 is evacuated with the aid of a purge gas. The purge gas may be the same or similar as the carrier gas. In an example, the purge gas is $N_2$, and the reaction chamber is purged by continuing the flow of $N_2$ into the reaction chamber while terminating the flow of one or more source gases. In another example, the reaction chamber between operations 610 and 615 is evacuated with the aid of a pumping system (i.e., applying a vacuum to the reaction chamber). In other cases, a reaction chamber is purged with the aid of a purge gas and a vacuum system.

While method 600 has been described as occurring in a reaction chamber, in some situations, one or more of the operations of the method 600 can occur in separate reaction chambers. In an example, operations 605 and 610 are conducted in a first reaction chamber, operations 615-625 are conducted in a second reaction chamber, and operations 630-640 are conducted in a third reaction chamber. The reactions spaces may be fluidically isolated from one another, such as in separate locations.

Figure 7:
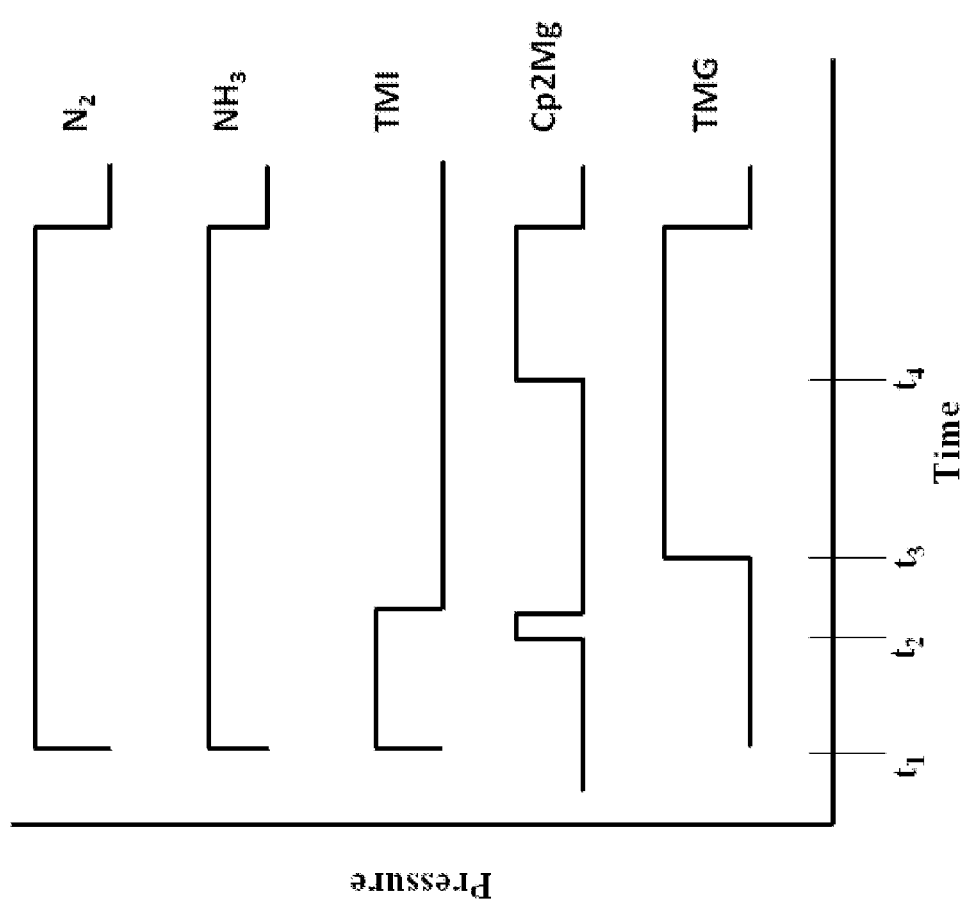
FIG. 7 shows pressure vs. time pulsing plots used to form a Mg delta doped layer and a p-GaN layer.

FIG. 7 shows a pressure vs. time pulsing diagram for forming a delta doped layer and a p-GaN layer over the delta doped layer. Pressure (y-axis) is shown as a function of time (x-axis). The pressure may correspond to the partial pressure of each source gas in the reaction chamber. With a substrate in a reaction chamber, at a first time ($t_1$), TMI and $NH_3$ are directed into the reaction chamber with the aid of an $N_2$ carrier gas. This forms a wetting layer over the substrate. Next, the wetting layer is delta doped with Mg with the aid of Cp2Mg, which is directed into the reaction chamber at a second time ($t_2$). The flow rates of $NH_3$ and $N_2$ are maintained during the pulse of Cp2Mg into the reaction chamber. The time period for Cp2Mg exposure is less than that of TMI; however, in some situations, the time period (i.e., pulse duration) for Cp2Mg exposure is greater than or equal to the time period for TMI exposure. The Cp2Mg pulse overlaps the TMI pulse. In other cases, the Cp2Mg pulse does not overlap the TMI pulse. In an example, the Cp2Mg pulse precedes the TMI pulse. In another example, the Cp2Mg pulse follows the TMI pulse.

Next, at a third time ($t_3$), TMG is directed into the reaction chamber. Prior to the introduction of TMG, the flow rate of Cp2Mg is terminated, but the flow rates of $NH_3$ and $N_2$ are maintained. Next, at a fourth time ($t_4$), Cp2Mg is directed into the reaction chamber to provide a p-type dopant for forming the p-GaN layer. The delta doped layer provides a p-type dopant (Mg) for incorporation into V-pits upon GaN deposition, which forms p-GaN in the V-pits. The second dose of Cp2Mg provides a p-type dopant for the subsequent growth of the p-GaN layer over the substrate and outside of the V-pits.

One or more layers of light emitting devices provided herein may be formed by a vapor (or gas phase) deposition technique. In some embodiments, one or more layers of the light emitting devices provided herein are formed by chemical vapor deposition (CVD), atomic layer deposition (ALD), plasma enhanced CVD (PECVD), plasma enhanced ALD (PEALD), metal organic CVD (MOCVD), hot wire CVD (HWCVD), initiated CVD (iCVD), modified CVD (MCVD), vapor axial deposition (VAD), outside vapor deposition (OVD) and/or physical vapor deposition (e.g., sputter deposition, evaporative deposition).

While methods and structures provided herein have been described in the context of light emitting devices having certain Group III-V semiconductor materials, such as gallium nitride, such methods and structures may be applied to other types of semiconductor materials. Methods and structures provided herein may be used with light emitting devices having active layers formed of gallium nitride (GaN), indium gallium nitride (InGaN), zinc selenide (ZnSe), aluminum nitride (AlN), aluminum gallium nitride (AlGaN), aluminum gallium indium nitride (AlGaInN) and zinc oxide (ZnO).

In some embodiments, layers and device structures provided herein, such as, for example, active layers (including well layers and barrier layers), n-type Group III-V semiconductor layers, p-type Group III-V semiconductor layers, are formed with the aid of a controller that is configured to regulate one or more processing parameters, such as the substrate temperature, precursor flow rates, growth rate, hydrogen flow rate and reaction chamber pressure. The controller includes a processor configured to aid in executing machine-executable code that is configured to implement the methods provided herein.

EXAMPLE

A substrate having an AlGaN electron blocking layer over an active layer is provided in a reaction chamber. The active layer and electron blocking layer include a plurality of V-pits. A p-GaN layer is formed on the AlGaN electron blocking layer by initially forming a p-type delta doped layer. At a substrate temperature between about 850° C. and 1000° C., trimethylindium (TMI) and ammonia ($NH_3$) are provided into the reaction chamber with the aid of an $N_2$ carrier gas and brought in contact with the electron blocking layer to form a wetting layer. Next, the wetting layer is delta doped with magnesium by directing Cp2Mg into the reaction chamber and exposing the wetting layer to Cp2Mg. In some cases, Cp2Mg is provided into the reaction chamber before, concurrently with, or after flowing TMI into the reaction chamber. Next, a layer of GaN is formed on the delta doped layer by introducing TMG into the reaction chamber. The p-type dopant in the delta doped layer provides p-type dopant for incorporation into the GaN layer in the V-pits. Prior to or subsequent to the p-GaN layer filling the V-pits, a source gas of a p-type dopant is introduced into the reaction chamber along with TMG and $NH_3$. The timing of the source gas of the p-type dopant is selected to provide a p-type dopant concentration, distribution and/or distribution as desired.

Unless the context clearly requires otherwise, throughout the description and the claims, words using the singular or plural number also include the plural or singular number respectively. Additionally, the words 'herein,' hereunder,"above,"below,' and words of similar import refer to this application as a whole and not to any particular portions of this application. When the word 'or' is used in reference to a list of two or more items, that word covers all of the following interpretations of the word: any of the items in the list, all of the items in the list and any combination of the items in the list.

It should be understood from the foregoing that, while particular implementations have been illustrated and described, various modifications may be made thereto and are contemplated herein. It is also not intended that the invention be limited by the specific examples provided within the specification. While the invention has been described with reference to the aforementioned specification, the descriptions and illustrations of embodiments of the invention herein are not meant to be construed in a limiting sense. Furthermore, it shall be understood that all aspects of the invention are not limited to the specific depictions, configurations or relative proportions set forth herein which depend upon a variety of conditions and variables. Various modifications in form and detail of the embodiments of the invention will be apparent to a person skilled in the art. It is therefore contemplated that the invention shall also cover any such modifications, variations and equivalents.

What is claimed is:

1. A light emitting diode (LED), comprising:
an n-type gallium nitride (GaN) layer, the n-type GaN layer doped with an n-type dopant;
an active layer adjacent to the n-type GaN layer, the active layer comprising indium (In) and having one or more V-pits;
a p-type delta-doped layer adjacent to the active layer, the p-type delta-doped layer including In and delta-doped with magnesium (Mg); and
a p-type GaN layer adjacent to the p-type delta-doped layer, the p-type GaN layer doped with a p-type dopant, the p-type GaN layer having a first portion and a second portion that is laterally bounded by the one or more V-pits, the first portion disposed over the active layer,
wherein an Mg intensity has a peak in the p-type delta-doped layer, and an In intensity has a first peak in the p-type delta-doped layer and a second peak in the active layer, the first peak of In intensity in the p-type delta-doped layer being lower than the second peak of In intensity in the active layer.

2. The LED of claim 1, wherein the concentration of the p-type dopant in the first portion is at least about $1\times10^{20}$ cm$^3$.

3. The LED of claim 1, further comprising a substrate adjacent to said n-type GaN layer.

4. The LED of claim 3, wherein the substrate is formed of silicon.

5. The LED of claim 1, further comprising a pit generation layer between the n-type GaN layer and the active layer, wherein the pit generation layer aids in the growth of the one or more V-pits during the formation of the active layer.

6. The LED of claim 1, further comprising an electron blocking layer between the active layer and the p-type GaN layer.

7. The LED of claim 1, wherein the active layer has a dislocation density between about $1\times10^8$ cm$^{-2}$ and $5\times10^9$ cm$^{-2}$.

8. The LED of claim 1, wherein the p type GaN layer extends into said one or more V-pits of the active layer.

9. The LED of claim 1, wherein the concentration of the p-type dopant in the second portion is at least about $1\times10^{20}$ cm$^{-3}$.

10. The LED of claim 1, wherein the concentration of the p-type dopant in the first portion and second portion is at least about $1\times10^{20}$ cm$^{-3}$.

11. The LED of claim 1, wherein the p-type delta-doped layer is configured to provide a p-type dopant to the second portion of the p-type GaN layer.

12. The LED of claim 1, wherein the first peak of In intensity in the p-type delta-doped layer is 1/100th or lower than the second peak of In intensity in the active layer.

13. The LED of claim 1, further comprising an electron blocking layer between the active layer and the p-type delta-doped layer.

14. The LED of claim 1, wherein the peak of Mg intensity in the p-type delta-doped layer coincides with the first peak of In intensity in the p-type delta-doped layer.

15. A light emitting diode (LED), comprising:
an n-GaN layer;
an active layer adjacent to the n-GaN layer, the active layer comprising indium (In);
an electron blocking layer adjacent to the active layer; and
a p-GaN layer adjacent to the electron blocking layer,
wherein the LED comprises Mg and In at an interface between the electron blocking layer and the p-GaN layer, an Mg intensity having a peak in the interface, an In intensity having a first peak in the interface and a second peak in the active layer, the first peak of the In intensity in the interface being lower than the second peak of In intensity in the active layer, and
wherein the p-GaN layer extends into one or more V-pits of the active layer.

16. The LED of claim 15, wherein the active layer has a dislocation density between about $1\times10^8$ cm$^{-2}$ and $5\times10^9$ cm$^{-2}$.

17. The LED of claim 15, wherein the electron blocking layer comprises aluminum gallium nitride (AlGaN).

18. The LED of claim 15, wherein the electron blocking layer comprises aluminum indium gallium nitride (AlInGaN).

19. The LED of claim 15, wherein the first peak In intensity in the interface is 1/100th or lower than the second peak In intensity in the active layer.

20. The LED of claim 15, wherein the peak Mg intensity in the interface coincides with the first peak In intensity in the interface.

21. The LED of claim 15, wherein the interface is a layer comprising In and N.

22. A light emitting diode (LED), comprising:
an n-GaN layer;
an active layer adjacent to the n-GaN layer, wherein the active layer comprises one or more V-pits and comprises indium (In);
an electron blocking layer adjacent to the active layer;
a wetting layer adjacent to the electron blocking layer, the wetting layer comprising In and N and doped with magnesium (Mg); and
a p-GaN layer adjacent to the wetting layer,
wherein the p-GaN layer extends into one or more V-pits of the active layer,
the wetting layer reduces the surface energy of Mg dopant on facets of the V-pits,
an Mg intensity has a peak in the wetting layer, and
an In intensity has a first peak in the wetting layer and a second peak in the active layer, the first peak of In intensity in the wetting layer being lower than the second peak of In intensity in the active layer.

23. The LED of claim 22, further comprising a substrate adjacent to said n-GaN layer.

24. The LED of claim 23, wherein the substrate is formed of silicon.

25. The LED of claim 22, wherein the active layer has a dislocation density between about $1\times10^8$ cm$^{-2}$ and $5\times10^9$ cm$^{-2}$.

26. The LED of claim 22, wherein the p-GaN layer has a first portion and a second portion, wherein the second portion is laterally bounded by the one or more V-pits, and wherein the first portion is disposed over the active layer.

27. The LED of claim 26, wherein the concentration of the p-type dopant in the second portion is at least about $1\times10^{20}$ cm$^{-3}$.

28. The LED of claim 22, wherein the electron blocking layer comprises aluminum gallium nitride (AlGaN).

29. The LED of claim 22, wherein the electron blocking layer comprises aluminum indium gallium nitride (AlInGaN).

30. The LED of claim 22, wherein the first peak of In intensity in the wetting layer is 1/100th or lower than the peak of In intensity in the active layer.

31. The LED of claim 22, further comprising a substrate adjacent to the n-GaN layer.

32. The LED of claim 31, wherein the substrate is formed of silicon.

* * * * *

UNITED STATES PATENT AND TRADEMARK OFFICE
CERTIFICATE OF CORRECTION

PATENT NO. : 8,698,163 B2
APPLICATION NO. : 13/248821
DATED : April 15, 2014
INVENTOR(S) : Steve Ting Page 1 of 1

It is certified that error appears in the above-identified patent and that said Letters Patent is hereby corrected as shown below:

In the Specification:
At column 9, line number 6, delete "1'10$^8$cm$^{-2}$" and replace with --1×10$^8$ cm$^{-2}$--.
At column 15, line number 66, delete "700° C." and replace with --700 °C--.
At column 16, line number 1, delete "800° C." and replace with --800 °C--.
At column 16, line number 1, delete "1050° C.," and replace with --1050 °C,--.
At column 16, line number 4, delete "850° C." and replace with --850 °C--.
At column 16, line number 4, delete "1000° C." and replace with --1000 °C.--.
At column 18, line number 35, delete "850° C." and replace with --850 °C--.
At column 18, line number 35, delete "1000° C.," and replace with --1000 °C,--.

In the Claims:
At column 19, claim number 2, line number 36, delete "1×10$^{20}$ cm$^3$" and replace with --1×10$^{20}$ cm$^{-3}$--.

Signed and Sealed this
Seventeenth Day of February, 2015

Michelle K. Lee
*Deputy Director of the United States Patent and Trademark Office*